US012216395B2

(12) United States Patent
Minamisawa (10) Patent No.: US 12,216,395 B2
(45) Date of Patent: Feb. 4, 2025

(54) OPTICAL UNIT (71) Applicant: NIDEC SANKYO CORPORATION, Nagano (JP)

(72) Inventor: Shinji Minamisawa, Nagano (JP)

(73) Assignee: NIDEC SANKYO CORPORATION, Nagano (JP)

(*) Notice: Subject to any disclaimer, the term of this patent is extended or adjusted under 35 U.S.C. 154(b) by 702 days.

(21) Appl. No.: 17/298,028

(22) PCT Filed: Apr. 15, 2019

(86) PCT No.: PCT/JP2019/016101
§ 371 (c)(1),
(2) Date: May 28, 2021

(87) PCT Pub. No.: WO2020/110338
PCT Pub. Date: Jun. 4, 2020

(65) Prior Publication Data
US 2022/0091477 A1 Mar. 24, 2022

(30) Foreign Application Priority Data
Nov. 30, 2018 (JP) .................................. 2018-224926

(51) Int. Cl.
*G03B 5/06* (2021.01)
*H05K 1/02* (2006.01)

(52) U.S. Cl.
CPC ............... *G03B 5/06* (2013.01); *H05K 1/028* (2013.01); *G03B 2205/0015* (2013.01)

(58) Field of Classification Search
CPC .. G03B 5/06; G03B 2205/0015; G03B 30/00; G03B 2205/0023; G03B 5/00;
(Continued)

(56) References Cited

U.S. PATENT DOCUMENTS 7,193,653 B2   3/2007 Lee
9,332,188 B2   5/2016 Takei et al.
(Continued)

FOREIGN PATENT DOCUMENTS

CN    1501666    6/2004
CN    103676404  3/2014
(Continued)

OTHER PUBLICATIONS

Office Action of China Counterpart Application, with English translation thereof, issued on Dec. 31, 2021, pp. 1-20.
(Continued)

*Primary Examiner* — Balram T Parbadia
*Assistant Examiner* — Gabriel A Sanz
(74) *Attorney, Agent, or Firm* — JCIPRNET (57) ABSTRACT An optical unit is provided and includes: a movable body having an optical module; a fixed body; a support mechanism turnably supporting the movable body with respect to the fixed body; a flexible circuit board whose one end is connected with a connection part provided in the movable body and which is disposed on a side in a first intersecting direction intersecting an optical axis direction with respect to the movable body; and a positioning part being disposed on the side in the first intersecting direction with respect to the movable body and positioning an other end of the flexible circuit board in the optical axis direction. The flexible circuit board is folded to be overlapped with each other when viewed in the optical axis direction. A position in the optical axis direction of a turning axis is located within a range from the connection part to the positioning part.

10 Claims, 8 Drawing Sheets (58) Field of Classification Search
CPC ............. H05K 1/028; H05K 2201/055; H05K 2201/10121; H05K 2201/10151; H05K 2203/167; H05K 1/189; H04N 23/54; H04N 23/55; H04N 23/57; H04N 23/687; G02B 7/04

See application file for complete search history.

(56) References Cited

U.S. PATENT DOCUMENTS

| | | | |
|---|---|---|---|
| 9,885,880 | B2 | 2/2018 | Hu et al. |
| 9,891,444 | B2 | 2/2018 | Minamisawa |
| 10,048,508 | B2 | 4/2018 | Sue et al. |
| 10,185,156 | B2 | 1/2019 | Minamisawa et al. |
| 10,197,887 | B2 | 2/2019 | Enta |
| 10,509,234 | B2 | 12/2019 | Hu et al. |
| 10,598,953 | B2 | 3/2020 | Minamisawa et al. |
| 10,983,362 | B2 | 4/2021 | Minamisawa |
| 11,555,978 | B2 * | 1/2023 | Lim ...................... H04N 23/54 |
| 2004/0198433 | A1 | 10/2004 | Lee |
| 2011/0286732 | A1 * | 11/2011 | Hosokawa ............. G03B 17/12 396/55 |
| 2012/0224840 | A1 | 9/2012 | Minamisawa et al. |
| 2014/0139693 | A1 | 5/2014 | Takei et al. |
| 2015/0009549 | A1 * | 1/2015 | Khechana ............... B81C 3/005 359/199.3 |
| 2016/0124242 | A1 * | 5/2016 | Minamisawa ....... G02B 27/646 359/557 |
| 2016/0170227 | A1 * | 6/2016 | Minamisawa ......... H04N 23/57 359/557 |
| 2018/0048221 | A1 | 2/2018 | Takeda et al. |
| 2018/0063395 | A1 | 3/2018 | Vehkapera |
| 2019/0045094 | A1 * | 2/2019 | Fletcher ............. G01B 11/2513 |
| 2019/0346748 | A1 * | 11/2019 | Kameyama .......... G03B 17/561 |

FOREIGN PATENT DOCUMENTS

| | | |
|---|---|---|
| CN | 103688217 | 3/2014 |
| CN | 104919366 | 9/2015 |
| CN | 106324941 | 1/2017 |
| CN | 107092066 | 8/2017 |
| CN | 107251385 | 10/2017 |
| CN | 107615160 | 1/2018 |
| CN | 108073012 | 5/2018 |
| CN | 108693677 | 10/2018 |
| JP | 2002131806 | 5/2002 |
| JP | 2003262913 | 9/2003 |
| JP | 2011069915 | 4/2011 |
| JP | 2013025117 | 2/2013 |
| JP | 2016138928 | 8/2016 |
| JP | 2016200809 | 12/2016 |
| JP | 2018169499 | 11/2018 |

OTHER PUBLICATIONS

"International Search Report (Form PCT/ISA/210) of PCT/JP2019/016101," mailed on Jul. 16, 2019, with English translation thereof, pp. 1-3.

* cited by examiner

OPTICAL UNIT

CROSS-REFERENCE TO RELATED APPLICATION

This application is a 371 application of the international PCT application serial no. PCT/JP2019/016101, filed on Apr. 15, 2019, which claims the priority benefits of Japan application no. 2018-224926 filed on Nov. 30, 2018. The entirety of each of the above-mentioned patent applications is hereby incorporated by reference herein and made a part of this specification.

TECHNICAL FIELD

The present invention relates to an optical unit.

BACKGROUND ART

Conventionally, various optical units have been used which include a movable body having an optical module, a fixed body displaceably holding the movable body, and a flexible circuit board connected with the movable body. For example, Patent Literature 1 discloses an optical unit which includes a movable module holding an optical element, a fixed body displaceably holding the movable module, and a flexible circuit board connected with the movable module.

CITATION LIST

Patent Literature

[Patent Literature 1] Japanese Patent Laid-Open No. 2011-69915

SUMMARY OF THE INVENTION

Problems to be Solved by the Invention

However, in a conventional optical unit as described above including a movable body, a fixed body and a flexible circuit board, the flexible circuit board is displaced with displacement of the movable body and thus, a load is applied to the flexible circuit board with the displacement of the flexible circuit board and, as a result, the flexible circuit board may be damaged. In view of the problem described above, an objective of the present invention is to reduce a load applied to the flexible circuit board.

Means to Solve the Problems

An optical unit in accordance with the present invention includes: a movable body having an optical module, a fixed body, a support mechanism which turnably supports the movable body with respect to the fixed body with one or a plurality of directions intersecting an optical axis direction as a direction of a turning axis, a flexible circuit board whose one end is connected with a connection part provided in the movable body and which is disposed on a side in a first intersecting direction intersecting the optical axis direction with respect to the movable body, and a positioning part which is disposed on the side in the first intersecting direction with respect to the movable body and positions the other end of the flexible circuit board in the optical axis direction. In addition, the flexible circuit board is folded so as to be overlapped with each other when viewed in the optical axis direction, and a position in the optical axis direction of the turning axis is located within a range from the connection part to the positioning part.

According to this aspect, since the flexible circuit board is folded so as to be overlapped with each other when viewed in the optical axis direction, a length of the flexible circuit board can be increased and, since responsiveness to displacement of the flexible circuit board is improved, a load applied to the flexible circuit board can be reduced. In addition, a position in the optical axis direction of the turning axis of the movable body is located within a range from the connection part to the positioning part and thus, a moving amount of the flexible circuit board with respect to a turning amount (turning angle) of the movable body can be reduced and a load applied to the flexible circuit board can be reduced. Further, since a load applied to the flexible circuit board can be reduced, a turning amount of the movable body can be increased.

In an optical unit of the present invention, it is preferable that the number of folding times of the flexible circuit board is once or twice. According to this structure, man-hours when the flexible circuit board is formed are restrained from excessively increasing.

In an optical unit of the present invention, it is preferable that the number of folding times of the flexible circuit board is an even number of times. When the number of folding times of the flexible circuit board is set to an even number of times, in an extended direction going from one end of the flexible circuit board to the other end, the flexible circuit board is directed toward a side approaching the movable body in the first intersecting direction in an odd-numbered folded portion, and the flexible circuit board is directed toward a side separated from the movable body in the first intersecting direction in an even-numbered folded portion. In other words, when the number of folding times of the flexible circuit board is set to an even number of times, the flexible circuit board can be easily disposed at a position separated from the movable body, and the flexible circuit board can be easily disposed so as to be directed toward a direction separated from the movable body and thus, contacting of the flexible circuit board with the movable body can be restrained. Further, a degree of freedom of wiring can be enhanced.

In an optical unit of the present invention, it is preferable that the position in the optical axis direction of the turning axis is located at a position different from the positioning part. A positional relationship in the optical axis direction is arranged to the connection part, the turning axis and the positioning part and thus, a distance in the optical axis direction from the connection part to the positioning part can be made larger. Therefore, a length of the flexible circuit board can be increased and a load applied to the flexible circuit board can be effectively reduced.

In an optical unit of the present invention, it is preferable that the position in the optical axis direction of the positioning part is different from a position of the connection part in the optical axis direction. According to this structure, a length of the flexible circuit board can be easily increased.

In an optical unit of the present invention, it is preferable that the fixed body is provided with no wall part which intersects the first intersecting direction between the connection part and the positioning part on the side in the first intersecting direction. According to this structure, the flexible circuit board extended from the connection part to the positioning part can be restrained from interfering with the fixed body.

In an optical unit of the present invention, it is preferable that the flexible circuit board is provided with a branch region which is branched in an extended direction directing from the one end toward the other end. According to this structure, a load applied to the flexible circuit board can be effectively reduced.

In an optical unit of the present invention, it is preferable that the branch region is formed so that the flexible circuit board is bilaterally symmetrical along the first intersecting direction when viewed in the extended direction. According to this structure, a load applied to the flexible circuit board can be especially effectively reduced.

In an optical unit of the present invention, it is preferable that the positioning part is integrally formed with the fixed body. When the positioning part is integrally formed with the fixed body, the flexible circuit board can be positioned with a high degree of accuracy.

In an optical unit of the present invention, it is preferable that the positioning part is structured so that the flexible circuit board is allowed to move in the first intersecting direction and is fixed to the fixed body. According to this structure, the flexible circuit board is allowed to move in the first intersecting direction and is fixed to the fixed body and thus, the flexible circuit board can be fixed to the fixed body in a state that a stress is not applied.

In an optical unit of the present invention, it is preferable that the optical unit includes a cover which covers at least a part of the flexible circuit board. According to this structure, the flexible circuit board can be restrained from contacting with other structure members and being damaged.

In an optical unit of the present invention, it is preferable that the optical unit includes a turning drive mechanism structured to turn the movable body with respect to the fixed body, and the turning drive mechanism is disposed at a position except the side in the first intersecting direction with respect to the movable body. According to this structure, the turning drive mechanism is disposed on a side where the flexible circuit board is not formed and thus, a size of the optical unit is not required to increase for restraining from contacting of the turning drive mechanism with the flexible circuit board and, as a result, a size of the optical unit can be reduced.

Effects of the Invention

According to the optical unit of the present invention, a load applied to the flexible circuit board can be reduced.

BRIEF DESCRIPTION OF THE DRAWINGS

In FIG. 5, (a) through (d) are schematic views showing optical units in accordance with the first embodiment through a fourth embodiment of the present invention.

In FIG. 6, (a) and (b) are schematic views showing optical units in accordance with a fifth embodiment and a sixth embodiment of the present invention.

DESCRIPTION OF EMBODIMENTS

Preferred embodiments of the present invention will be described below with reference to the accompanying drawings. The same reference signs are used in the same structures in the respective embodiments and the same structures are described only in the first embodiment and the descriptions of the same structures are omitted in the subsequent embodiments.

Figure 3:
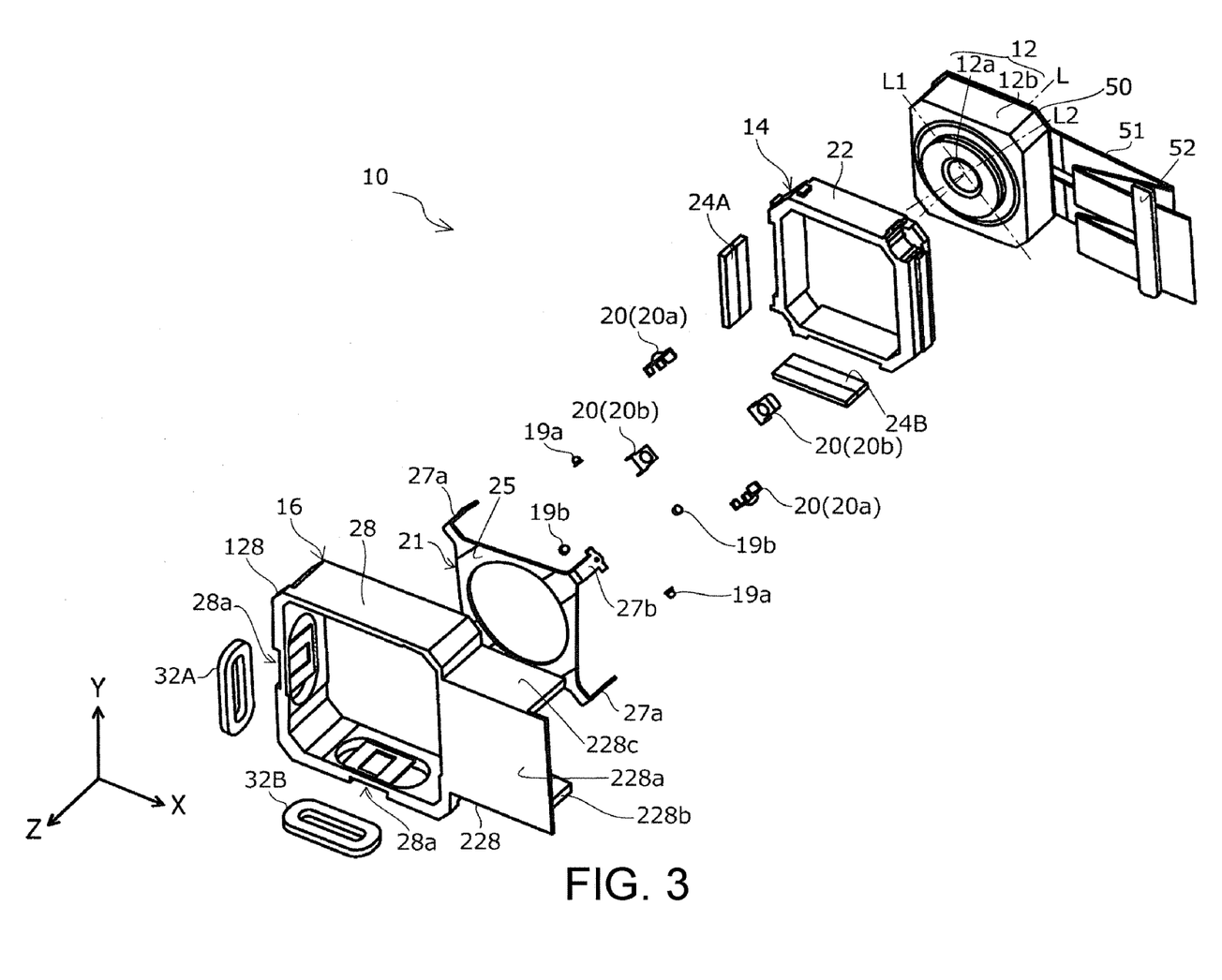
FIG. 3 is an exploded perspective view showing the optical unit in accordance with the first embodiment of the present invention.
Figure 4:
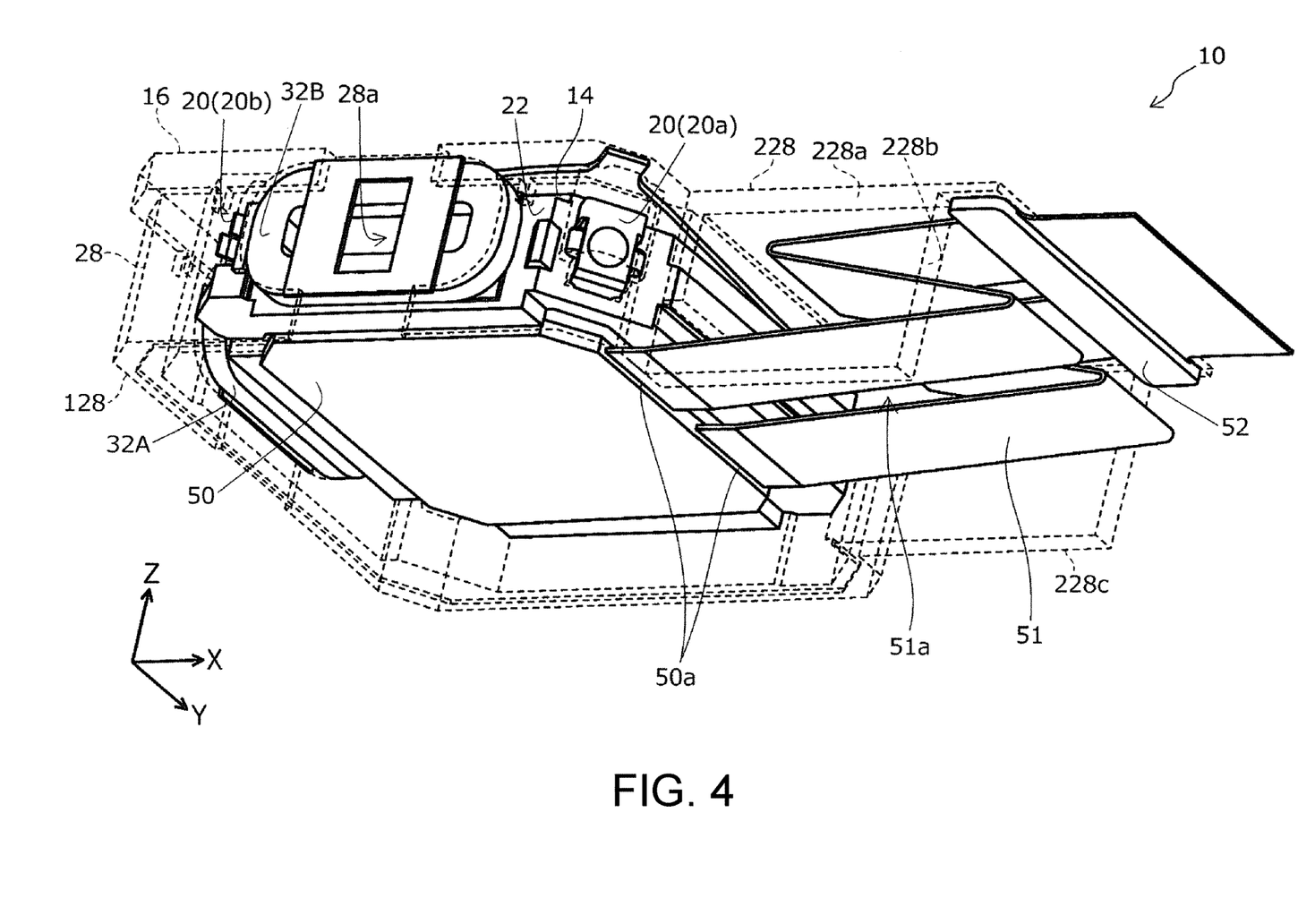
FIG. 4 is a perspective view showing the optical unit in accordance with the first embodiment of the present invention in which a fixed body of the optical unit is indicated in a transparent manner.
Figure 5:
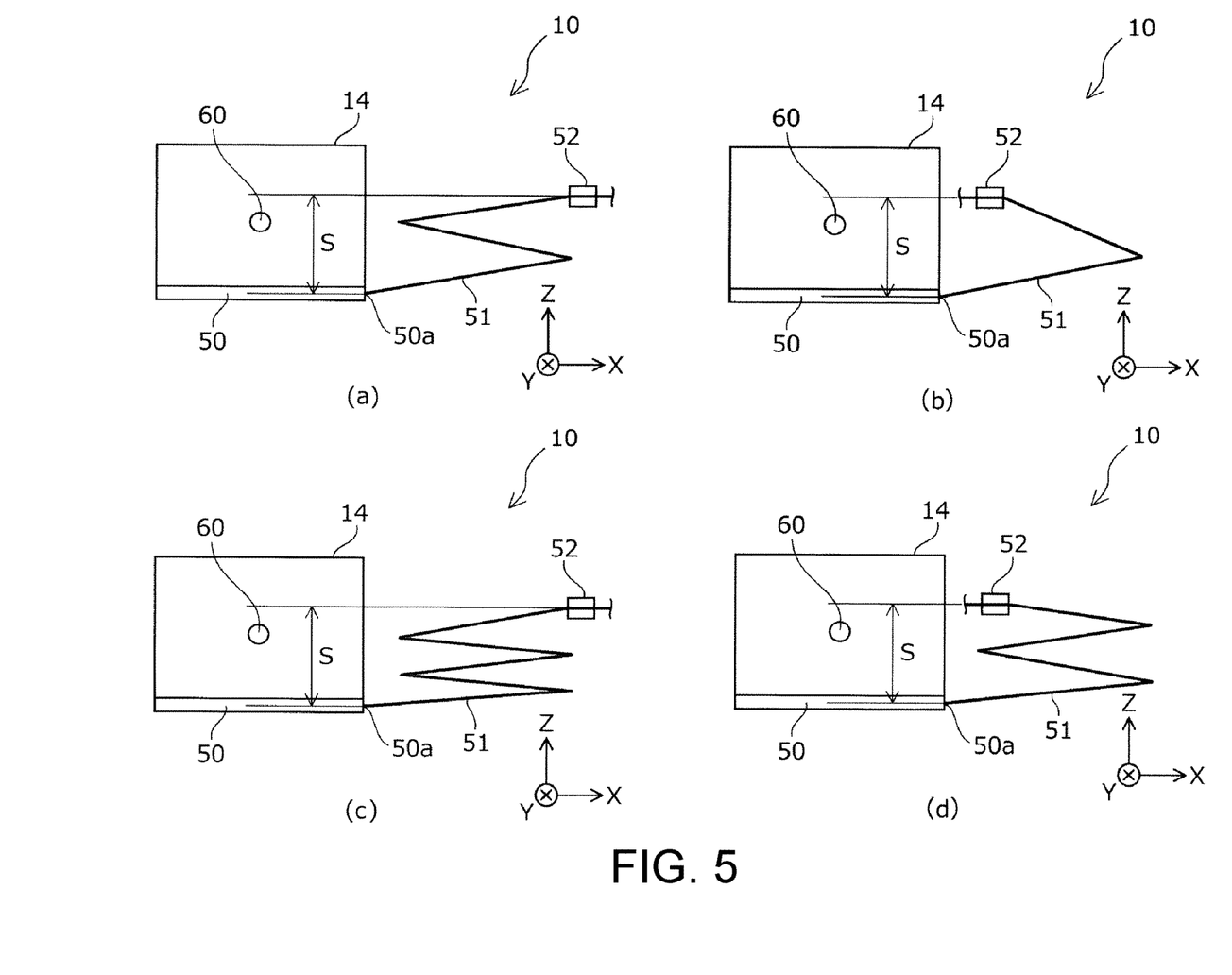

[First Embodiment](FIG. 1 Through FIG. 4, and (a) of FIG. 5)

Figure 1:
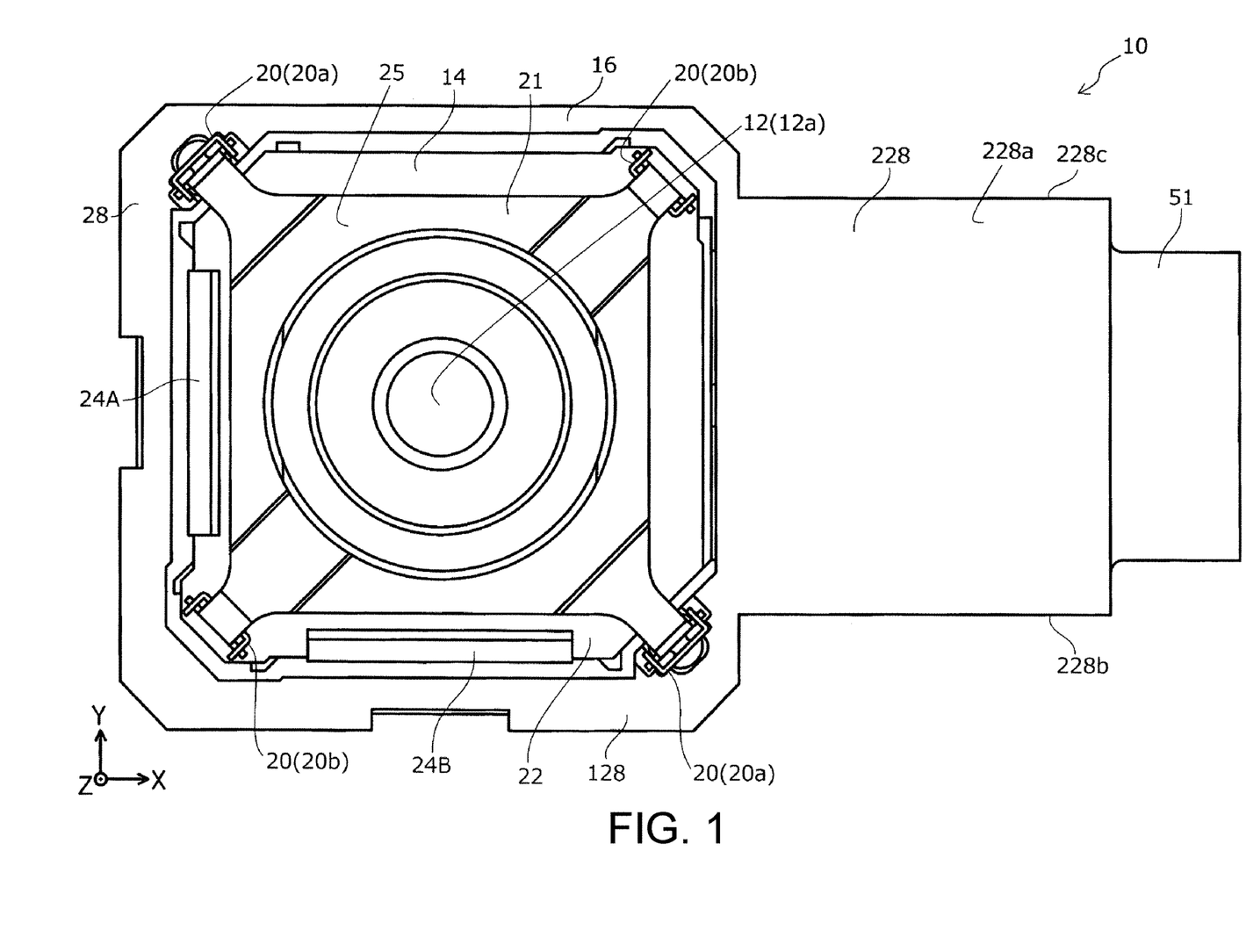
FIG. 1 is a plan view showing an optical unit in accordance with a first embodiment of the present invention.
Figure 2:
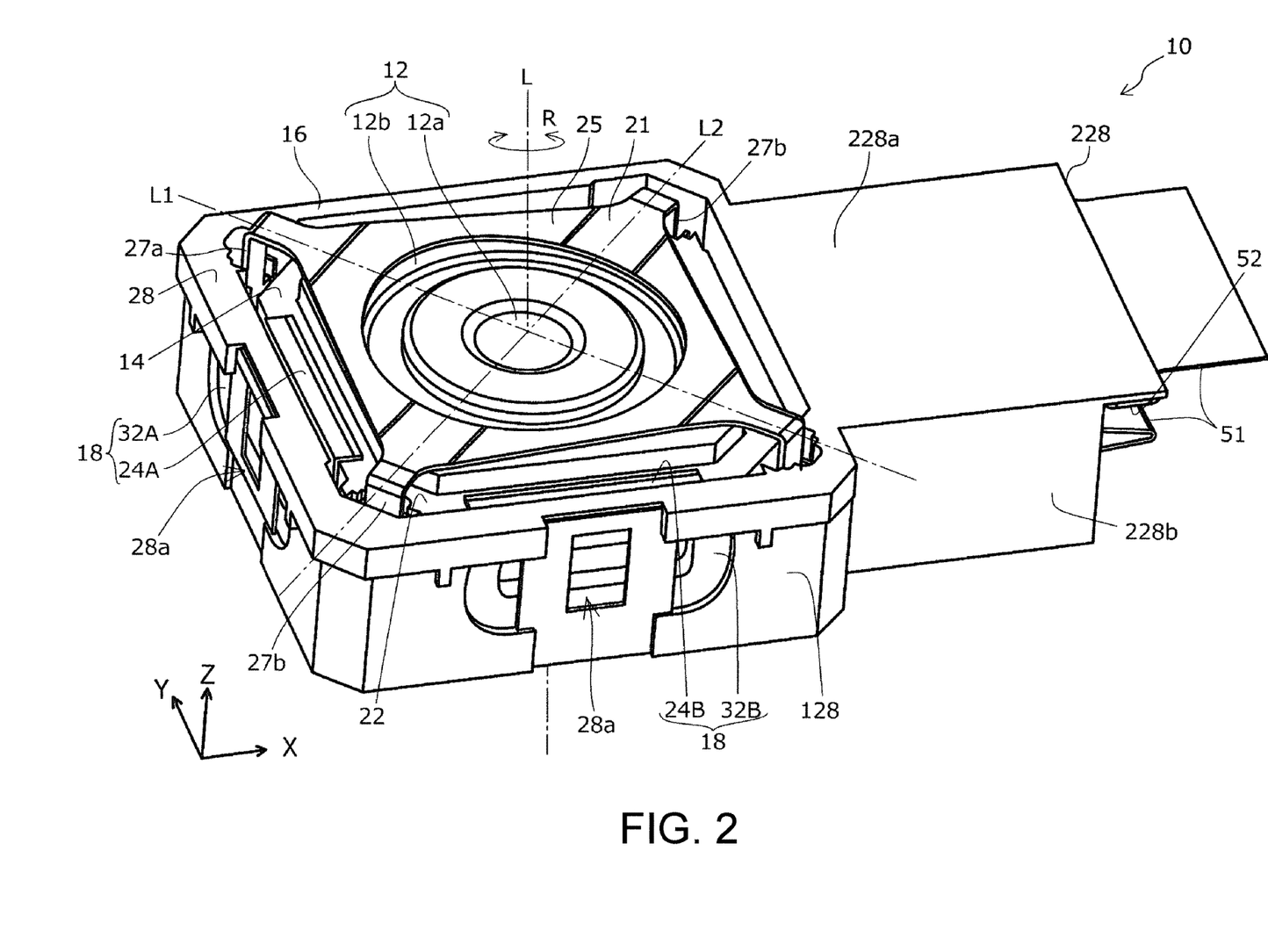
FIG. 2 is a perspective view showing the optical unit in accordance with the first embodiment of the present invention.

First, an optical unit in accordance with a first embodiment of the present invention will be described below with reference to FIG. 1 through FIG. 4 and (a) of FIG. 5. In FIG. 2 and FIG. 3, the alternate long and short dash line with the reference sign "L" indicates an optical axis, the alternate long and short dash line with the reference sign "L1" indicates a first axial line intersecting the optical axis, and the alternate long and short dash line with the reference sign "L2" indicates a second axial line "L2" intersecting the optical axis "L" and the first axial line "L1". Further, an "R"-direction indicates a direction around the optical axis. In the respective drawings, the "Z"-axis direction is an optical axis direction, the "X"-axis direction is a direction intersecting the optical axis, in other words, an axial direction of yawing, and the "Y"-axis direction is a direction intersecting the optical axis, in other words, an axial direction of pitching.

<Entire Schematic Structure of Optical Unit>

In FIG. 1 through FIG. 4, a structure of an optical unit 10 in accordance with an embodiment of the present invention will be described below. The optical unit 10 includes a movable body 14 having an optical module 12, and a fixed body 16 which holds the movable body 14 in displaceable states in a direction (pitching direction) whose turning axis is the "Y"-axis direction and in a direction (yawing direction) whose turning axis is the "X"-axis direction. Further, the optical unit 10 includes a turning drive mechanism 18 structured to drive the movable body 14 in the pitching direction and the yawing direction, and a support mechanism 20 which turnably supports the movable body 14 in the pitching direction and the yawing direction with respect to the fixed body 16. In addition, the optical unit 10 includes a gimbal mechanism 21 in which first support parts 19*a* for turnably supporting the movable body 14 around the first axial line "L1" are provided in first support part extended parts 27*a*, and second support parts 19*b* turnably supported around the second axial line "L2" by a member on a fixed body 16 side is provided in second support part extended parts 27*b* (see FIG. 3).

<Regarding Optical Module>

In this embodiment, the optical module 12 is formed in a substantially rectangular case shape and is used as a thin camera or the like which is, for example, mounted on a cellular phone with a camera and a tablet type PC. The optical module 12 includes a lens 12*a* on an object side and is incorporated with an optical device for imaging and the like in an inside of a rectangular case-shaped housing 12*b*. The optical module 12 in this embodiment is, as an example, incorporated with an actuator for correcting a shake of pitching (shake in a turning direction with the "Y"-axis direction as a turning axis) occurred in the optical module 12 and a shake of yawing (shake in a turning direction with the "X"-axis direction as a turning axis) and is structured so as to be capable of correcting a shake of pitching and a shake of yawing.

In this embodiment, the optical module 12 is structured so as to be capable of correcting a shake of pitching and a shake of yawing. However, the present invention is not limited to this structure. For example, the optical module 12 may be structured so as to be capable of correcting only one of a shake of pitching and a shake of yawing.

<Regarding Movable Body>

In FIG. 1 through FIG. 4, the movable body 14 includes the optical module 12, a holder frame 22, and magnets 24A and 24B. The holder frame 22 is structured as a rectangular frame-shaped member which is provided so as to surround four remaining faces except a front face (face on an object side) where the lens 12a of the optical module 12 is provided and a rear face on an opposite side. The holder frame 22 in this embodiment is, as an example, structured so that the optical module 12 is detachably attached. The magnets 24A and 24B for pitching and yawing corrections are attached to the holder frame 22 by utilizing outer faces of two faces which face the fixed body 16.

<Regarding Fixed Body>

In FIG. 1 through FIG. 4, the fixed body 16 includes a fixed frame 28 and coils 32A and 32B. In this embodiment, the fixed frame 28 is structured of a rectangular frame-shaped member 128, which is provided so as to surround at least three faces of the holder frame 22 of the movable body 14 in a direction around the optical axis ("R"-direction), and an extended part 228 having a wall part 228a, a wall part 228b and a wall part 228c which are extended to an outer side along the "X"-axis direction. The wall part 228a is a wall part which covers a front face (face on object side), and the wall part 228b and the wall part 228c are wall parts which cover in the "Y"-axis direction. In this embodiment, a region of the member 128 surrounded from three directions by the wall part 228a, the wall part 228b and the wall part 228c of the extended part 228 is formed to be a space (a wall part is not provided).

The fixed body 16 in this embodiment is structured so that a flexible circuit board 51 described below is capable of being covered from three directions by the wall part 228a, the wall part 228b and the wall part 228c, and the fixed body 16 is provided with a positioning part 52 (see FIG. 4) which positions the flexible circuit board 51 in the "Z"-axis direction. When a cover which covers at least a part of the flexible circuit board 51 is provided like the optical unit 10 in this embodiment, the flexible circuit board 51 can be restrained from contacting with other structure members and being damaged. The extended part 228 in this embodiment is not provided with a wall part on a side facing the wall part 228a. This is because that workability is enhanced when the flexible circuit board 51 is to be disposed in the extended part 228. However, the present invention is not limited to such a structure. For example, a wall part may be provided on a side facing the wall part 228a, or a wall part may be attached after the flexible circuit board 51 has been disposed in the extended part 228.

As shown in FIG. 2 and the like, the coils 32A and 32B are respectively attached to coil attaching parts 28a. In this embodiment, the coil 32A and the coil 32B are structured to be winding coils as an example. However, the coil may be structured of a pattern substrate (coil substrate) in which a coil is incorporated in wiring of a substrate as a pattern.

In this embodiment, in a state that the movable body 14 has been disposed in an inside of the fixed body 16, the magnet 24A and the coil 32A and the magnet 24B and the coil 32B are respectively set in a facing state. Further, in this embodiment, a pair of the magnet 24A and the coil 32A and a pair of the magnet 24B and the coil 32B structure the turning drive mechanism 18. Corrections of pitching and yawing of the movable body 14 are performed by the turning drive mechanism 18.

Corrections of pitching and yawing are performed as follows. When a shake in both or one of directions of a pitching direction and a yawing direction is occurred in the optical unit 10, the shake is detected by a magnetic sensor (Hall element) not shown and the turning drive mechanism 18 is driven based on the result. Alternatively, a shake of the optical unit 10 may be detected by using a shake detection sensor (gyroscope) or the like. The turning drive mechanism 18 is operated so as to correct the shake based on a detected result of the shake. In other words, an electric current is supplied to the respective coils 32A and 32B so that the movable body 14 is moved in a direction which cancels the shake of the optical unit 10 and, as a result, the shake is corrected.

As described above, the optical unit 10 in this embodiment includes the turning drive mechanism 18 which is structured to turn the movable body 14 with respect to the fixed body 16 with the axial direction of pitching and the axial direction of yawing as turning axes. In this case, it is preferable that the turning drive mechanism 18 is disposed at a position except a side in the "X"-axis direction where the flexible circuit board 51 is disposed (except a first intersecting direction side intersecting the optical axis direction) with respect to the movable body 14. According to this structure, the turning drive mechanism 18 is disposed on a side where the flexible circuit board 51 is not formed and thus, a size of the optical unit 10 is not required to increase for restraining the turning drive mechanism 18 from contacting with the flexible circuit board 51 and, as a result, a size of the optical unit 10 can be reduced. In this case, the word "turning" in the present specification is not required to turn for 360° and includes a swing in the turning direction.

In this embodiment, a drive source for correcting a shake is not limited to a voice coil motor which is structured of the respective pairs of the coils 32A and 32B and the magnets 24A and 24B like the turning drive mechanism 18. As another drive source, a stepping motor, a device utilizing a piezo element or the like may be used.

<Regarding Support Mechanism>

The support mechanism 20 includes a metal plate 20a, which forms a protruding curved face in a hemispherical shape toward an outer side of the optical unit 10, and a metal plate 20b which forms a protruding curved face in a hemispherical shape toward an inner side of the optical unit 10. The metal plate 20a is disposed at two positions facing each other of four corners of the rectangular frame-shaped member 128 of the fixed body 16, and the metal plate 20b is disposed at two positions facing each other of four corners of the movable body 14 in a rectangular frame shape. In this embodiment, the rectangular frame-shaped member 128 and the movable body 14 in a rectangular frame shape are disposed so that the positions of their four corners are aligned with each other, and the metal plates 20a and the metal plates 20b are disposed at four corners one by one.

In the support mechanism 20 in this embodiment, the first support part 19a provided in the first support part extended part 27a of the gimbal mechanism 21 is disposed on an inner side of the protruding curved face in a hemispherical shape of the metal plate 20a which faces an outer side. The support mechanism 20 supports the gimbal mechanism 21 with respect to the fixed body 16 by such a structure. Further, the second support part 19b provided in the second support part extended part 27b of the gimbal mechanism 21 is disposed on an inner side of the protruding curved face in a hemispherical shape of the metal plate 20b which faces an inner side. The support mechanism 20 supports the gimbal mechanism 21 with respect to the movable body 14 by such a structure. In other words, the support mechanism 20 in this embodiment is structured so that the movable body 14 can be turnably supported with respect to the fixed body 16 with one or a plurality of directions (at least one of the "X"-axis direction and the "Y"-axis direction) intersecting the optical axis direction ("Z"-axis direction) as a direction of a turning axis. The support mechanism 20 in this embodiment is structured so that the movable body 14 is allowed to turn with the axial direction of pitching as a turning axis and that the movable body 14 is allowed to turn with the axial direction of yawing as a turning axis. However, the support mechanism 20 may be structured so that the movable body 14 is allowed to turn in a rolling direction.

<Gimbal Mechanism>

The gimbal mechanism 21 is a mechanism which is formed by bending a flat plate member made of metal and is provided with a spring property. Specifically, the gimbal mechanism 21 is, as an example, structured by providing with a gimbal frame part 25 provided on an object side, and the first support part extended parts 27a and the second support part extended parts 27b which are formed by bending by 90° in the optical axis direction from four corner parts of the gimbal frame part 25. In this case, the first support part extended part 27a and the second support part extended part 27b are not required to be entirely formed in a plate shape, but parts of the first support part extended part 27a and the second support part extended part 27b may be formed in a plate shape to provide a spring property. Further, one of the first support part extended part 27a and the second support part extended part 27b may be made in another shape (for example, rod shape) other than a plate shape.

<Imaging Element>

As shown in FIG. 3 and FIG. 4, the optical module 12 includes an imaging element 50 on an opposite side to an object side. As shown in FIG. 4, the flexible circuit board 51 is connected with a connection part 50a of the imaging element 50. In this embodiment, the connection part 50a of the imaging element 50 is formed on the extended part 228 side, and the flexible circuit board 51 is covered by the wall part 228a, the wall part 228b and the wall part 228c of the extended part 228 in directions other than an opposite side to an object side. In this case, the connection part 50a for the flexible circuit board 51 is not required to be provided in the imaging element 50 and may be provided in a portion of the movable body 14 other than the imaging element 50.

<Flexible Circuit Board>

As shown in FIG. 4, one end of the flexible circuit board 51 is connected with the connection part 50a provided in the movable body 14. Further, as described above, the flexible circuit board 51 is disposed on the first intersecting direction side with respect to the movable body 14. Further, the other end of the flexible circuit board 51 is positioned in the optical axis direction ("Z"-axis direction) with respect to the movable body 14 by a positioning part 52 disposed on the first intersecting direction side. The positioning part 52 is a plate-shaped member which is attached to the wall part 228a so as to have a space therebetween, and the other end of the flexible circuit board 51 is positioned in the "Z"-axis direction by passing it through the space.

As shown in FIG. 4, (a) of FIG. 5 and the like, the flexible circuit board 51 in this embodiment is folded twice so as to overlap with each other when viewed in the "Z"-axis direction. In this case, as shown in (a) of FIG. 5, in the optical unit 10 in this embodiment, a position in the "Z"-axis direction of a turning axis 60 of the movable body 14 with respect to the fixed body 16 in the axial direction of pitching along the "Y"-axis direction is located within a range "S" which is from the connection part 50a to the positioning part 52. The range "S" from the connection part 50a to the positioning part 52 corresponds to a bendable range in which the flexible circuit board 51 is capable of being resiliently bent. Further, accurately, the position in the "Z"-axis direction of the positioning part 52 means a position in the "Z"-axis direction where the flexible circuit board 51 is positioned by the positioning part 52.

The optical unit 10 in this embodiment is structured so that a length of the flexible circuit board 51 can be increased by folding the flexible circuit board 51 so as to be overlapped with each other when viewed in the optical axis direction, and that a load applied to the flexible circuit board 51 can be reduced by improving responsiveness to displacement of the flexible circuit board 51. In addition, the optical unit 10 in this embodiment is structured so that the position in the optical axis direction of the turning axis 60 of the movable body 14 is set within the range "S" from the connection part 50a to the positioning part 52 and thus, a moving amount of the flexible circuit board 51 with respect to a turning amount (turning angle) of the movable body 14 can be reduced and a load applied to the flexible circuit board 51 can be reduced. As described above, since a load applied to the flexible circuit board 51 is reduced, a turning amount of the movable body 14 when the movable body 14 is turned can be increased without damaging of the flexible circuit board 51. In this embodiment, the expression of "position in the optical axis direction of the turning axis 60" means a turning center (swing center) of the turning axis 60. For example, the "position in the optical axis direction of the turning axis 60" corresponds to "a position of an intersecting point with the optical axis in the optical axis direction of the turning axis 60".

In this case, the meaning of the expression that "the position in the optical axis direction of the turning axis 60 of the movable body 14 is set within the range "S" from the connection part 50a to the positioning part 52" also includes a case that the position in the optical axis direction of the turning axis 60 of the movable body 14 is the same position as the position of the positioning part 52. However, it is preferable that, like the optical unit 10 in this embodiment, the position in the optical axis direction of the turning axis 60 is located at a different position (connection part 50a side with respect to the positioning part 52) instead of the same position as the positioning part 52. This is because that a positional relationship in the optical axis direction is arranged in the order of the connection part 50a, the turning axis 60 and the positioning part 52 and thus, a distance in the optical axis direction from the connection part 50a to the positioning part 52 can be made larger. Therefore, a length of the flexible circuit board 51 can be increased and a load applied to the flexible circuit board 51 can be effectively reduced.

Further, as shown in FIG. 4 and the like, the flexible circuit board 51 in this embodiment is branched in an extended direction directing from one end to the other end. As described above, it is preferable that the flexible circuit board 51 is provided with a branch region 51a (see FIG. 4). According to this structure, a load applied to the flexible circuit board 51 can be effectively reduced. In this case, a size of the branch region 51a is not especially limited, and the flexible circuit board 51 may be branched in the entire region from one end to the other end like the flexible circuit board 51 in this embodiment or may be branched only in some region. In addition, a plurality of branch regions 51a may be provided.

Further, it is further preferable that, like the flexible circuit board 51 in this embodiment, the branch region 51a is structured so that the flexible circuit board 51 is bilaterally symmetrical along the first intersecting direction when viewed in its extended direction, in other words, symmetric with a center part in the "Y"-axis direction (axial direction of yawing) as a reference. According to this structure, a load applied to the flexible circuit board 51 can be further effectively reduced. However, a shape of the branch region 51a is not especially limited and the flexible circuit board 51 may be structured to be branched into three or more portions other than two portions.

In this embodiment, as described above, the positioning part 52 is a plate-shaped member which is attached to the wall part 228a so as to form a space and the other end of the flexible circuit board 51 is positioned in the "Z"-axis direction by passing the other end through the space. In other words, the positioning part 52 is integrally formed with the fixed body 16 by being attached and fixed to the wall part 228a. When the positioning part 52 is integrally formed with the fixed body 16, the flexible circuit board 51 can be positioned with a high degree of accuracy. In this case, the expression of "integrally formed with the fixed body 16" is not limited to "integrally molded", and the expression includes a case that the positioning part 52 is attached and fixed to the fixed body 16 like this embodiment.

Further, the positioning part 52 in this embodiment is, as described above, structured to position the flexible circuit board 51 only in the "Z"-axis direction by passing the flexible circuit board 51 through the space and thus, the flexible circuit board 51 can be fixed to the fixed body 16 (wall part 228a) in a state that the flexible circuit board 51 is allowed to move in the "X"-axis direction (movement in the first intersecting direction). As described above, when it is structured that the flexible circuit board 51 is fixed to the fixed body 16 in a state that the flexible circuit board 51 is allowed to move in the "X"-axis direction, the flexible circuit board 51 can be fixed to the fixed body 16 in a state that a stress is not applied.

[Second Embodiment] ((b) of FIG. 5)

(b) of FIG. 5 is a schematic view showing an optical unit 10 in a second embodiment and a view corresponding to (a) of FIG. 5 in the optical unit 10 of the first embodiment. The same reference signs indicate the structure members common to the first embodiment and their detailed descriptions are omitted. The optical unit 10 in this embodiment is similarly structured to the optical unit 10 in the first embodiment except a structure of the flexible circuit board 51 and a position where the positioning part 52 is formed.

In the optical unit 10 in this embodiment, the number of folding times of the flexible circuit board 51 is once. In this case, similarly to the optical unit 10 in the first embodiment, a position in the "Z"-axis direction of the turning axis 60 of the movable body 14 with respect to the fixed body 16 in the axial direction of pitching along the "Y"-axis direction is located within a range "S" from the connection part 50a to the positioning part 52.

Like the optical unit 10 of the first embodiment and the optical unit 10 of this embodiment, it is preferable that the number of folding times of the flexible circuit board 51 is once or twice. This is because that man-hours when the flexible circuit board 51 is formed are restrained from excessively increasing. However, when the number of folding times of the flexible circuit board 51 is increased, a load applied to the flexible circuit board 51 may be effectively reduced. Therefore, it is preferable that the number of folding times of the flexible circuit board 51 is determined in accordance with a use of the optical unit 10.

[Third Embodiment] ((c) of FIG. 5)

(c) of FIG. 5 is a schematic view showing an optical unit 10 in a third embodiment and a view corresponding to (a) of FIG. 5 in the optical unit 10 of the first embodiment. The same reference signs indicate the structure members common to the first embodiment and the second embodiment and their detailed descriptions are omitted. The optical unit 10 in this embodiment is similarly structured to the optical unit 10 in the first embodiment except a structure of the flexible circuit board 51.

In the optical unit 10 of this embodiment, the number of folding times of the flexible circuit board 51 is four times. In this case, similarly to the optical unit 10 in the first embodiment, a position in the "Z"-axis direction of the turning axis 60 of the movable body 14 with respect to the fixed body 16 in the axial direction of pitching along the "Y"-axis direction is located within a range "S" from the connection part 50a to the positioning part 52.

It is preferable that the number of folding times of the flexible circuit board 51 is an even number of times like the optical unit 10 in the first embodiment and the optical unit 10 in this embodiment. When the number of folding times of the flexible circuit board 51 is set to an even number of times, in an extended direction going from one end of the flexible circuit board 51 to the other end, the flexible circuit board 51 is directed toward a side approaching the movable body 14 in the first intersecting direction in an odd-numbered folded portion, and the flexible circuit board 51 is directed toward a side approaching separated from the movable body 14 in the first intersecting direction in an odd numbered even-numbered folded portion. In other words, when the number of folding times of the flexible circuit board 51 is set to an even number of times, the flexible circuit board 51 can be easily disposed at a position separated from the movable body 14, and the flexible circuit board 51 can be easily disposed toward a direction separated from the movable body 14 and thus, contacting of the flexible circuit board 51 with the movable body 14 can be restrained. Further, a degree of freedom of wiring can be enhanced.

[Fourth Embodiment] ((d) of FIG. 5)

(d) of FIG. 5 is a schematic view showing an optical unit 10 in a fourth embodiment and a view corresponding to (a) of FIG. 5 in the optical unit 10 of the first embodiment. The same reference signs indicate the structure members common to the first embodiment through the third embodiment and their detailed descriptions are omitted. The optical unit 10 in this embodiment is similarly structured to the optical unit 10 in the first embodiment except a structure of the flexible circuit board 51 and a position where the positioning part 52 is formed.

In the optical unit 10 in this embodiment, the number of folding times of the flexible circuit board 51 is three times. In this embodiment, similarly to the optical unit 10 in the first embodiment, a position in the "Z"-axis direction of the turning axis 60 of the movable body 14 with respect to the fixed body 16 in the axial direction of pitching along the "Y"-axis direction is located within a range "S" from the connection part 50a to the positioning part 52.

Figure 6:
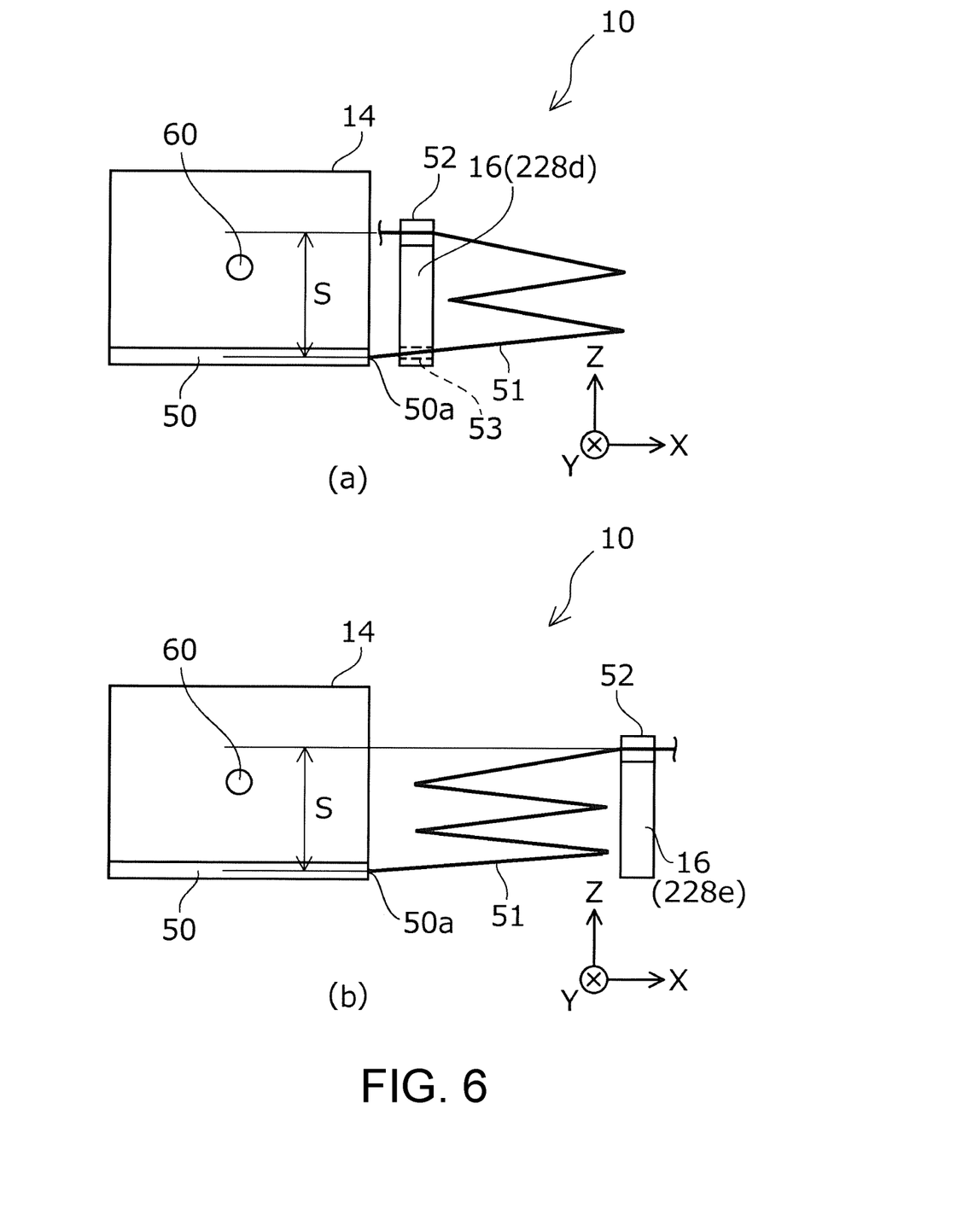

[Fifth Embodiment] ((a) of FIG. 6)

(a) of FIG. 6 is a schematic view showing an optical unit 10 in a fifth embodiment and a view corresponding to (a) of FIG. 5 in the optical unit 10 of the first embodiment. The same reference signs indicate the structure members common to the first embodiment through the fourth embodiment and their detailed descriptions are omitted. The optical unit 10 in this embodiment is similarly structured to the optical unit 10 in the first embodiment except a shape of the fixed body 16, a structure of the flexible circuit board 51 and a position where the positioning part 52 is formed.

In the optical unit 10 in this embodiment, the number of folding times of the flexible circuit board 51 is three times. Further, the fixed body 16 is provided with a wall part 228d on the first intersecting direction side with respect to the movable body 14, and the positioning part 52 is formed in the wall part 228d. The flexible circuit board 51 is passed through a space part 53 provided in the wall part 228d. In this case, similarly to the optical unit 10 in the first embodiment, a position in the "Z"-axis direction of the turning axis 60 of the movable body 14 with respect to the fixed body 16 in the axial direction of pitching along the "Y"-axis direction is located within a range "S" from the connection part 50a to the positioning part 52.

[Sixth Embodiment] ((b) of FIG. 6)

(b) of FIG. 6 is a schematic view showing an optical unit 10 in a sixth embodiment and a view corresponding to (a) of FIG. 5 in the optical unit 10 of the first embodiment. The same reference signs indicate the structure members common to the first embodiment through the fifth embodiment and their detailed descriptions are omitted. The optical unit 10 in this embodiment is similarly structured to the optical unit 10 in the first embodiment except a shape of the fixed body 16, a structure of the flexible circuit board 51 and a position where the positioning part 52 is formed.

In the optical unit 10 in this embodiment, the number of folding times of the flexible circuit board 51 is four times. Further, the fixed body 16 is provided with a wall part 228e on the first intersecting direction side with respect to the movable body 14, and the positioning part 52 is formed in the wall part 228e. In this case, similarly to the optical unit 10 in the first embodiment, a position in the "Z"-axis direction of the turning axis 60 of the movable body 14 with respect to the fixed body 16 in the axial direction of pitching along the "Y"-axis direction is located within a range "S" from the connection part 50a to the positioning part 52.

It is preferable that the fixed body 16 is not provided with a wall part intersecting the first intersecting direction between the connection part 50a and the positioning part 52 on the first intersecting direction side like the optical unit 10 in this embodiment. As it is clear from a comparison with the optical unit 10 in the fifth embodiment, the flexible circuit board 51 extended from the connection part 50a to the positioning part 52 can be restrained from interfering with the fixed body 16 (for example, with an inner wall of the space part 53 formed in the wall part).

Figure 7:
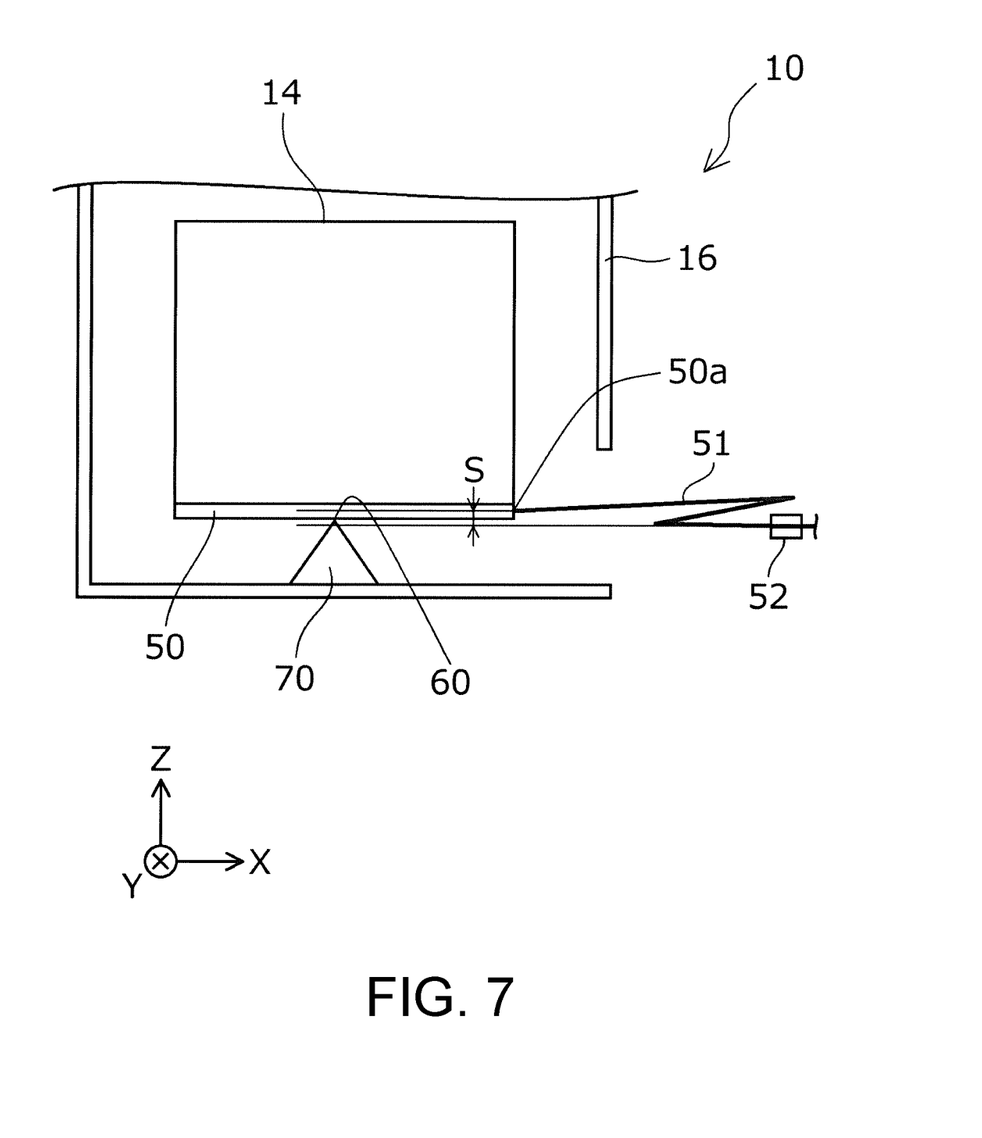
FIG. 7 is a schematic view showing an optical unit in accordance with a seventh embodiment of the present invention.

[Seventh Embodiment] (FIG. 7)

FIG. 7 is a schematic view showing an optical unit 10 in accordance with a seventh embodiment of the present invention. The same reference signs indicate the structure members common to the first embodiment through the sixth embodiment and their detailed descriptions are omitted. The optical units 10 in the first embodiment through the sixth embodiment are optical units structured to include the gimbal mechanism 21 as a mechanism for moving the movable body 14 with respect to the fixed body 16. On the other hand, the optical unit 10 in the seventh embodiment is structured to include a pivot mechanism 70 instead of the gimbal mechanism 21.

In the optical unit 10 in this embodiment, the number of the folding times of the flexible circuit board 51 is twice. Further, similarly to the optical units 10 in the first embodiment through the sixth embodiment, a position in the "Z"-axis direction of the turning axis 60 of the movable body 14 with respect to the fixed body 16 (position of a point contact portion of the pivot mechanism 70 with the movable body 14) is located within a range "S" from the connection part 50a to the positioning part 52.

<Positional Relationship between Turning Axis, Connection Part and Positioning Part in Optical Axis Direction>

Figure 8:
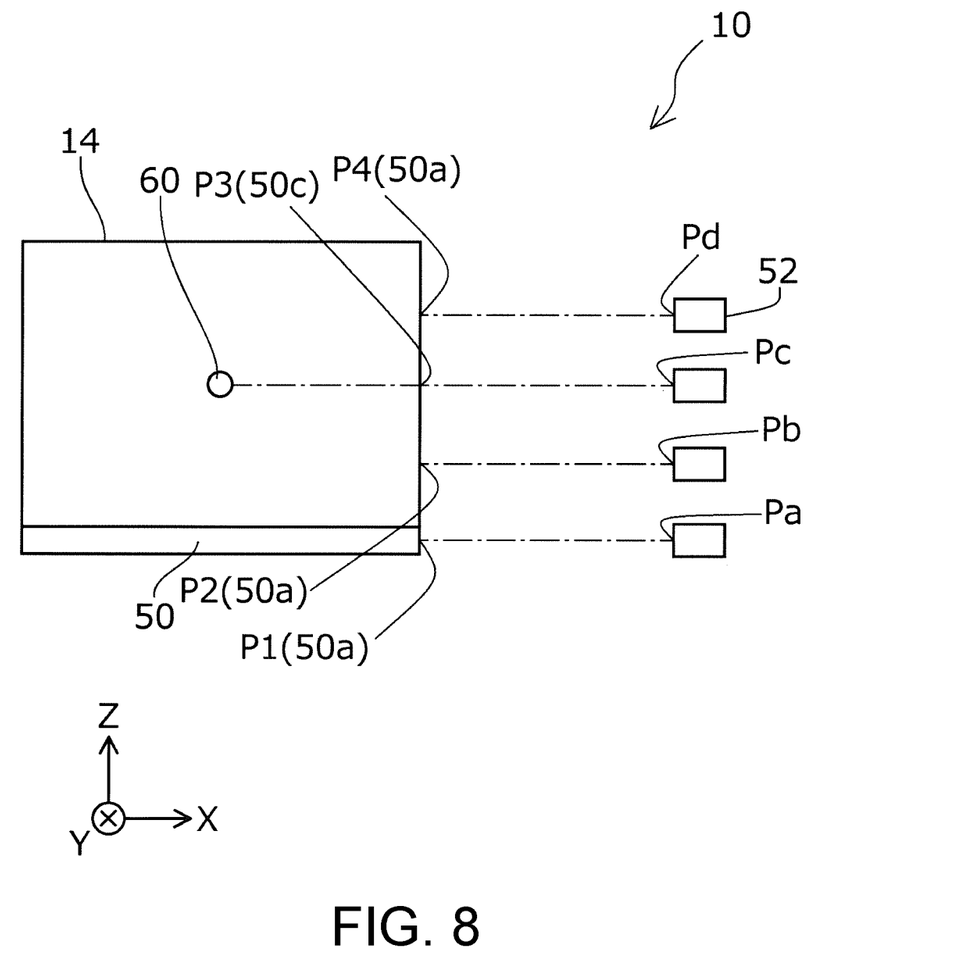
FIG. 8 is an explanatory schematic view showing an optical unit in accordance with the present invention.

A preferred positional relationship between a position of the turning axis 60, a position of the connection part 50a and the positioning part 52 in the "Z"-axis direction (optical axis direction) will be described below with reference to FIG. 8. In FIG. 8, "P1", "P2", "P3" and "P4" indicate a position of the connection part 50a, and "Pa", "Pb", "Pc" and "Pd" indicate a position (positioning position) of the positioning part 52.

First, a case that a position of the connection part 50a is located at "P1" will be described below. When a position of the positioning part 52 is located at "Pc" and "Pd", a position in the "Z"-axis direction of the turning axis 60 is located within a range from the connection part 50a to the positioning part 52 and thus, a load applied to the flexible circuit board 51 can be preferably reduced. On the other hand, in a case that a position of the positioning part 52 is located at "Pa" and "Pb", a position in the "Z"-axis direction of the turning axis 60 is located on an outer side with respect to a range from the connection part 50a to the positioning part 52 and thus, there may be a case that a load applied to the flexible circuit board 51 cannot be sufficiently reduced.

Next, a case that a position of the connection part 50a is located at "P2" will be described below. When a position of the positioning part 52 is located at "Pc" and "Pd", a position in the "Z"-axis direction of the turning axis 60 is located within a ranges from the connection part 50a to the positioning part 52 and thus, a load applied to the flexible circuit board 51 can be preferably reduced. On the other hand, in a case that a position of the positioning part 52 is located at "Pa" and "Pb", a position in the "Z"-axis direction of the turning axis 60 is located on an outer side with respect to a range from the connection part 50a to the positioning part 52 and thus, there may be a case that a load applied to the flexible circuit board 51 cannot be sufficiently reduced.

Next, a case that a position of the connection part 50a is located at "P3" will be described below. In any case that a position of the positioning part 52 is located at positions of "Pa", "Pb", "Pc" and "Pd", a position in the "Z"-axis direction of the turning axis 60 is located within a range from the connection part 50a to the positioning part 52 and thus, a load applied to the flexible circuit board 51 can be preferably reduced.

Finally, a case that a position of the connection part 50a is located at "P4" will be described below. When a position of the positioning part 52 is located at "Pa", "Pb" and "Pc", a position in the "Z"-axis direction of the turning axis 60 is located within a range from the connection part 50a to the positioning part 52 and thus, a load applied to the flexible circuit board 51 can be preferably reduced. On the other hand, in a case that a position of the positioning part 52 is located at "Pd", a position in the "Z"-axis direction of the turning axis 60 is located on an outer side with respect to a range from the connection part 50a to the positioning part 52 and thus, there may be a case that a load applied to the flexible circuit board 51 cannot be sufficiently reduced.

A preferred positional relationship in the "Z"-axis direction between a position of the turning axis 60, a position of the connection part 50a and the positioning part 52 is described above. However, it is especially preferable that a position of the positioning part 52 in the optical axis direction is different from a position of the connection part 50a in the optical axis direction. For example, the flexible circuit board 51 is not required to be folded to both of an object side and an opposite side to the object side in order to align a position of the positioning part 52 with a position of the connection part 50a in the optical axis direction, and a length of the flexible circuit board 51 can be easily increased.

The present invention is not limited to the above-mentioned embodiments and can be realized in various structures within a range not apart from the objective. For example, technical features in the examples corresponding to the technical features in the respective embodiments described in the summary of the invention may be appropriately substituted and combined in order to solve a part or all of the above-mentioned objective or, in order to achieve a part or all of the above-mentioned effects. Further, in a case that the technical feature is not described to be essential in the present specification, the technical feature may be appropriately eliminated.

For example, it is preferable that a folding hold part which holds a folded portion of the flexible circuit board 51 is provided in the folded portion. For example, when the flexible circuit board 51 is bent at 180° in a folded portion by a folding hold part so that the bent flexible circuit boards 51 are held so as not to contact with each other, a wiring region of the flexible circuit board 51 can be effectively reduced, and damage of the flexible circuit board 51 due to contact of the bent flexible circuit boards 51 can be restrained.

Further, the imaging element 50 may be disposed on the first intersecting direction side with respect to the optical unit 10 in the above-mentioned embodiments, for example, on the first intersecting direction side with the turning axis 60 as a reference. In this case, the expression that "on the first intersecting direction side with the turning axis 60 as a reference" means that a center in the "X"-axis direction of the imaging element 50 is located on the first intersecting direction side with respect to the turning axis 60. According to this arrangement, the flexible circuit board 51 can be shortened in an inside of the fixed body 16 and a size of the fixed body 16 can be reduced and, as a result, a size of the optical unit 10 can be reduced.

The invention claimed is:

1. An optical unit comprising:
a movable body comprising an optical module having an object side;
a fixed body, having an extended part extended from an inner side to an outer side along a first intersecting direction that intersects an optical axis direction;
a support mechanism which turnably supports the movable body with respect to the fixed body with one or a plurality of directions intersecting the optical axis direction as a direction of a turning axis;
a flexible circuit board whose one end is connected with a connection part provided in the movable body and which is disposed on the extended part at the inner side in the first intersecting direction intersecting the optical axis direction with respect to the movable body;
a positioning part which is disposed on the extended part at the outer side in the first intersecting direction with respect to the movable body and positions an other end of the flexible circuit board in the optical axis direction; and
a cover, which covers at least a part of the flexible circuit board,
wherein
the flexible circuit board is folded so as to be overlapped with each other when viewed in the optical axis direction;
a position in the optical axis direction of the turning axis is located within a range from the connection part to the positioning part;
the cover, which is the extended part, includes a first wall part, a second wall part and a third wall part that cover the at least a part of the flexible circuit board in three directions other than an opposite side to the object side;
the positioning part is integrally formed with the fixed body;
the fixed body is provided with the positioning part which positions the flexible circuit board in a Z-axis direction that is the optical axis direction;
the positioning part is a plate-shaped member which is attached to the first wall part so as to form a space and the other end of the flexible circuit board is positioned in the Z-axis direction by passing the other end through the space;
the first wall portion is configured to cover the connection part of flexible circuit board, the positioning part and a region between the connection part and the positioning part.

2. The optical unit according to claim 1, wherein a number of folding times of the flexible circuit board is once or twice.

3. The optical unit according to claim 1, wherein a number of folding times of the flexible circuit board is an even number of times.

4. The optical unit according to claim 1, wherein the position in the optical axis direction of the turning axis is located at a position different from the positioning part.

5. The optical unit according to claim 1, wherein the position in the optical axis direction of the positioning part is different from a position of the connection part in the optical axis direction.

6. The optical unit according to claim 1, wherein the fixed body comprises no wall part which intersects the first intersecting direction between the connection part and the positioning part on the side in the first intersecting direction.

7. The optical unit according to claim 1, wherein the flexible circuit board comprises a branch region which is branched in an extended direction directing from the one end toward the other end.

8. The optical unit according to claim 7, wherein the branch region is provided so that the flexible circuit board is bilaterally symmetrical along the first intersecting direction when viewed in the extended direction.

9. The optical unit according to claim 7, wherein the positioning part is structured so that the flexible circuit board is fixed to the fixed body in a state that movement in the first intersecting direction of the flexible circuit board is allowed.

10. The optical unit according to claim 1, further comprising:
a turning drive mechanism structured to turn the movable body with respect to the fixed body,
wherein the turning drive mechanism is disposed at a position except the side in the first intersecting direction with respect to the movable body.

* * * * *